United States Patent
Park et al.

(10) Patent No.: US 6,429,084 B1
(45) Date of Patent: Aug. 6, 2002

(54) MOS TRANSISTORS WITH RAISED SOURCES AND DRAINS

(75) Inventors: Heemyong Park, LaGrangeville, NY (US); Fariborz Assaderaghi, San Diego, CA (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/885,828

(22) Filed: Jun. 20, 2001

(51) Int. Cl.$^7$ .................. H01L 21/336; H01L 21/76
(52) U.S. Cl. ............. 438/305; 438/300; 438/424; 438/479; 438/589
(58) Field of Search ................ 438/307, 303, 438/305, 231, 300, 264, 589, 424, 429; 257/368, 24, 57, 396, 318

(56) References Cited

U.S. PATENT DOCUMENTS

| | | | | |
|---|---|---|---|---|
| 5,493,575 A | * | 2/1996 | Kitamura | 372/102 |
| 5,943,581 A | * | 8/1999 | Lu et al. | 438/243 |
| 6,127,228 A | * | 10/2000 | Lee | 438/149 |
| 6,204,138 B1 | * | 3/2001 | Krishnan et al. | 438/151 |
| 6,204,532 B1 | * | 3/2001 | Gambino et al. | 257/329 |
| 6,223,432 B1 | * | 5/2001 | Dennison et al. | 29/846 |
| 6,274,913 B1 | * | 8/2001 | Brigham et al. | 257/24 |
| 6,300,657 B1 | * | 10/2001 | Bryant et al. | 257/314 |
| 6,326,262 B1 | * | 12/2001 | Temmler et al. | 438/222 |
| 2001/0044188 A1 | * | 11/2001 | Heo et al. | 438/268 |
| 2002/0011617 A1 | * | 1/2002 | Kubo et al. | 257/301 |

* cited by examiner

Primary Examiner—Micheal S. Lebentritt
(74) Attorney, Agent, or Firm—Jay H. Anderson

(57) ABSTRACT

In raised source/drain CMOS processing, the prior art problem of lateral epi growth on the gate stack interfering physically with the raised S/D structures and producing device characteristics that vary along the length of the gate and the problem of overetch of the STI oxide during the preclean step is solved by using a sacrificial nitride layer to block both the STI region and the gate stack, together with a process sequence in which the halo and extension implants are performed after the S/D implant anneal.

11 Claims, 3 Drawing Sheets

MOS TRANSISTORS WITH RAISED SOURCES AND DRAINS

FIELD OF THE INVENTION

The field of the invention is submicron MOS circuit processing with raised source/drain structures.

BACKGROUND OF THE INVENTION

In forming raised source-drain (S/D) transistors in submicron dimensions, a problem has arisen—that the polysilicon (poly) gate acts as a base for epitaxial growth as well as the exposed silicon in the S/D region. The epitaxial silicon (epi) in the gate expands laterally and not only physically blocks portions of the S/D, but also causes variation in device characteristics along the length of the transistor because of interference between the expanded gate and the S/D extension implant.

In addition, the preclean step that is required to remove oxide before the epi growth can overetch the shallow trench isolation (STI) fill, exposing silicon during the epi growth step. With this unwanted epi at or near the isolation, there is a potential for shorting across the isolation.

SUMMARY OF THE INVENTION

The invention relates to a method of transistor formation that provides a protective layer over the gate and over the STI during the epi growth step, thereby preventing unwanted epi growth on the gate and/or in the isolation.

A feature of the invention is the formation of temporary poly sidewalls that are removed before the S/D implantation, so that the extension and/or halo implants are performed after the S/D implant, and preferably after the S/D anneal.

Another feature of the invention is forming an oxide/nitride/oxide sandwich layer on top of the poly so the poly top surface is not exposed during the removal of the temporary poly sidewall spacer.

Yet another feature of the invention is damaging the protective layer by ion implantation before its removal.

DESCRIPTION OF THE PREFERRED EMBODIMENT

Figure 1:
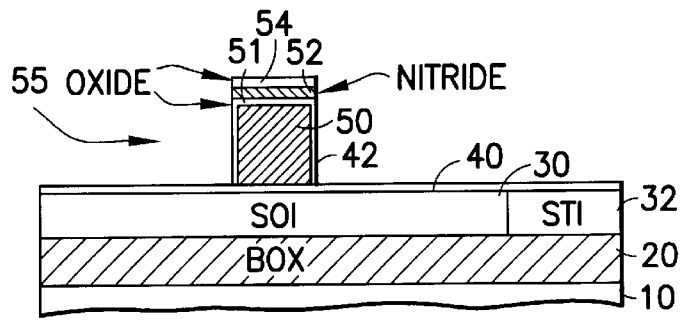
FIGS. 1–11 show various stages of a transistor being formed according to the invention.

Beginning with FIG. 1, there is shown a portion of a silicon SOI substrate 10 with a buried oxide layer (box) 20, illustratively 200 nm thick and device layer 30, illustratively 10 nm–200 nm thick. Initial conventional processing steps (referred to in the claims as preparing the substrate) include threshold adjust implants, pad oxide and nitride deposition, well formation, etc. In addition, the shallow trench isolation (STI) 32 has been patterned, filled and planarized, the gate oxide 40 has been grown, the gate stack layers (including poly 50, nominally 120 nm thick, first oxide 51, nominally 10 nm thick, first nitride 52, nominally 20 nm thick, and second oxide 54, nominally 20 nm thick) have been put down and patterned to form gate 55. An optional side oxide 42, nominally 3 nm thick, has been grown that will protect the gate during the removal of the temporary sidewall spacers.

Figure 2:
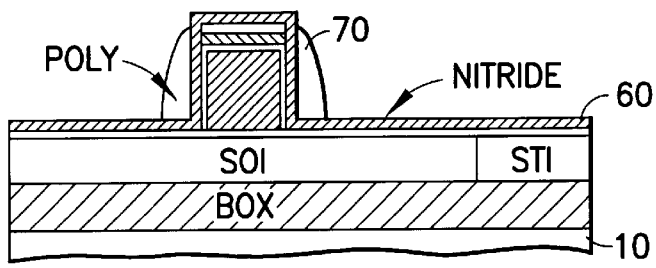

Next, as shown in FIG. 2, a protective nitride layer 60, nominally 20 nm thick, has been deposited and a set of temporary poly gate sidewall spacers 70 has been formed. The width of spacers 70 will be set to define the area for the halo and extension implants, nominally 100 nm wide. Protective nitride 60 will prevent unwanted epi growth on the gate and/or in the STI region.

Figure 3:
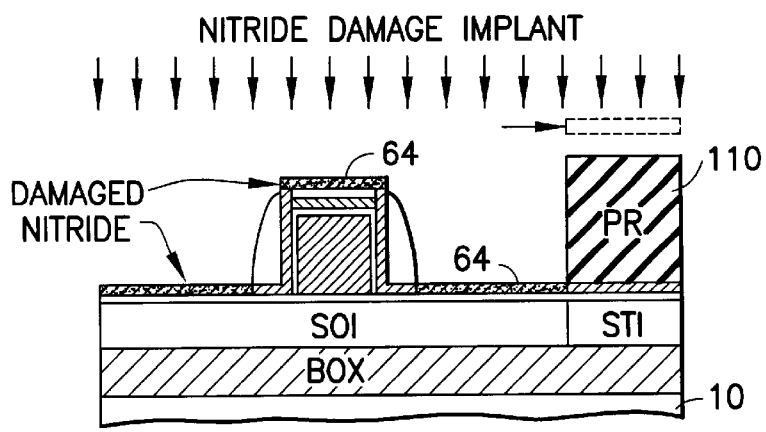

An optional step of damaging nitride 60 by ion implantation over the S/D area is shown in FIG. 3, with the STI being blocked by resist 110. Preferably, the damage implant is from column IV of the periodic table, so that the same mask can be used for both NFETs and PFETs. If desired, two masks could be used, with the same species as the PFET or NFET being implanted in the appropriate opening, or one mask could be used, with the other polarity of transistors receiving a compensating dose. This damage implant step may be omitted if a directional etch ("reactive ion etch" or "dry etch") is used to remove the exposed portion 64 ("exposed portion" meaning the portion of layer 60 that is not covered by the resist or by the sidewalls 70) of protective layer 60 or if the thickness of layer 60 is small enough that lateral etching in a wet etch is not significant. Ordinarily, the nitride is removed by a conventional process of etching in hot phosphoric acid. In the illustrative embodiment, as will be explained below, the thickness of layer 60 is enough to block the S/D implant, so that the wet etch would have had too much lateral extent without the damage implant.

Figure 4:
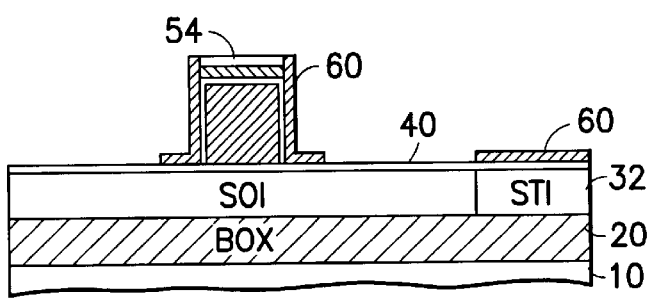

The next FIG. 4, shows the result of etching the exposed portion of the nitride protective layer and stripping the poly sidewalls 70. It is not necessary to strip the sidewalls at this time and they may be retained to block ion implants later, if desired. The result of the stripping operation is that the gate stack has second oxide layer 54 as its top layer. The order of etching damaged nitride 64 and of stripping spacer 70 may be reversed, if desired.

Figure 5:
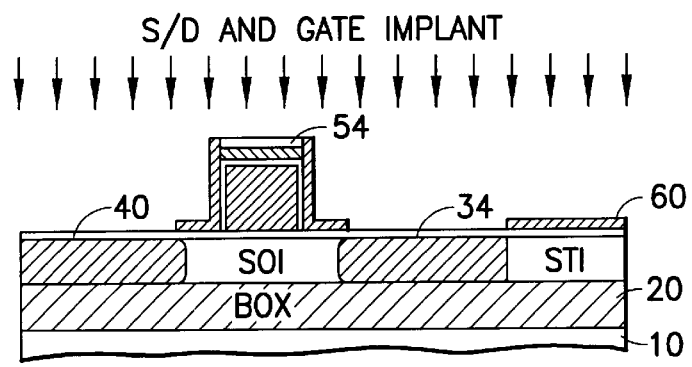

FIG. 5 shows the process of ion implantation of the sources and drains 34 of the transistor. Note that, in this embodiment, layer 60 is thick enough to block the implant in the region that will contain the extension implant. If the two-mask alternative was chosen for the nitride damage implant, this step may be omitted.

Figure 6:
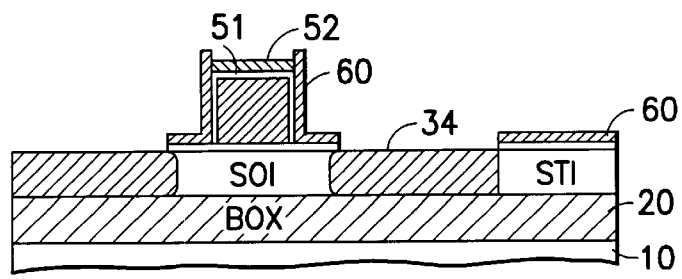

FIG. 6 shows the result of stripping second oxide 54 and oxide 40, thus exposing a clean surface on S/D 34 and leaving nitride 52 as the top layer in the gate stack. Preferably, a conventional wet etch is used.

Figure 7:
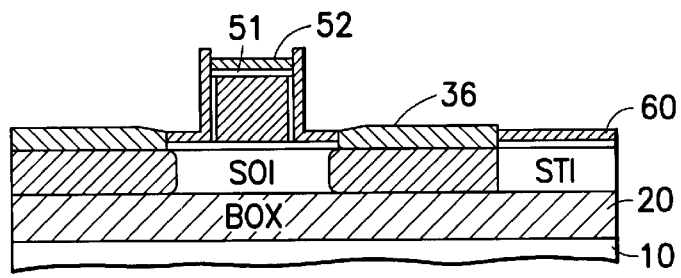

The epi process (conventional temperature range from about 750° C. to about 850° C.) is now limited to grow epi layers 36 only on S/D 34, since the gate and the STI are now protected by nitride protective layer 60. The result is shown in FIG. 7.

Figure 8:
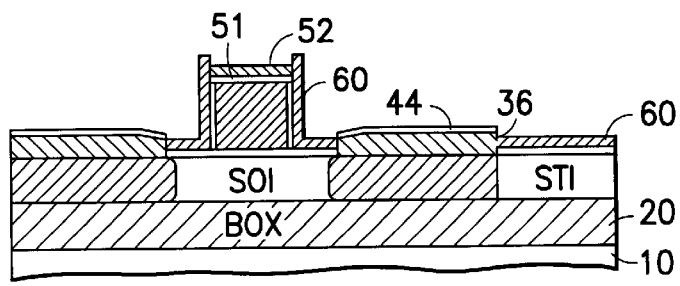

A thin film of thermal oxide (preferably, low temperature rapid thermal oxidation at a temperature of less than about 750° C.) is grown on the top surface of epi 36, since that is the only exposed silicon surface. The result is shown in FIG. 8. It is an advantageous feature of the invention that the sensitive extension and halo implants have not yet been made and therefore are not affected by this thermal step.

Figure 9:
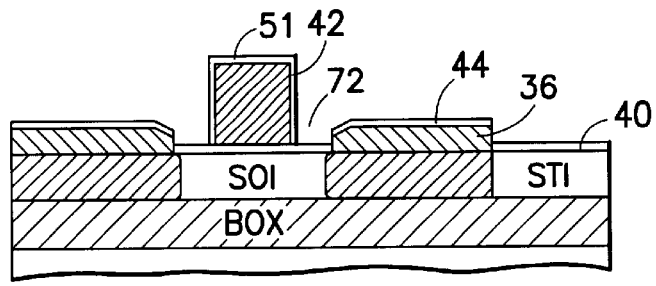

FIG. 9 shows the result of stripping nitride 60, leaving gate 50 surrounded by an oxide layer (42 and 51) and epi 36 also covered by oxide 44. A pair of apertures 72 are located between epi 36 and gate 55 for the low-dose implants.

Figure 10:
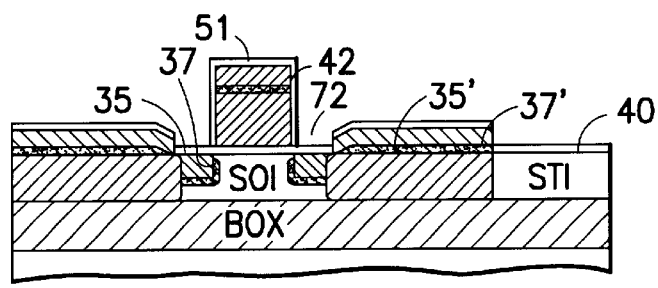

FIG. 10 shows the result of performing extension and halo implants, leaving areas 35 and 37, respectively (and 35' and 37' in the epi). These implants also implant epi 36. The ion species and dosage of the implants will be set by the transistor designer. Note that the dose applied to epi 35' will be less than the S/D implant dose, but that does not matter because the epi will be silicided. Separate masks and implants will be used for the two species of transistor.

Figure 11:
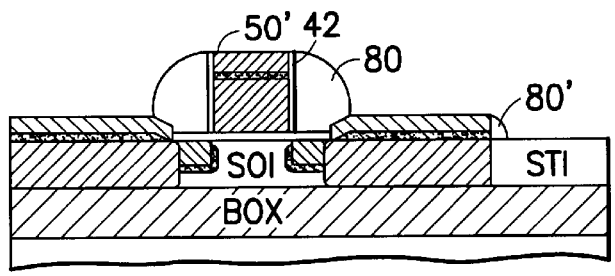

FIG. 11 now shows the result of forming oxide sidewalls 80 on the gate (preferably a low temperature PECVD process), including a conventional step of a directional etch to clean off horizontal surfaces. This etch also removes oxide 51, exposing the top of poly gate 50. A small sidewall 80' is formed at the edge of the isolation 32 that does not have the same effect as previous sidewalls. Note that sidewalls 80 do not perform the function that counterparts in the prior art did—that of blocking the S/D implant performed after the extension implant. They do perform another function of blocking potential shorts between the contacts to the S/D and the gate. In addition, sidewalls 80 protect the silicon in the extension area during a silicidation step. Without these sidewalls, the silicide would consume Si in that area.

Figure 12:
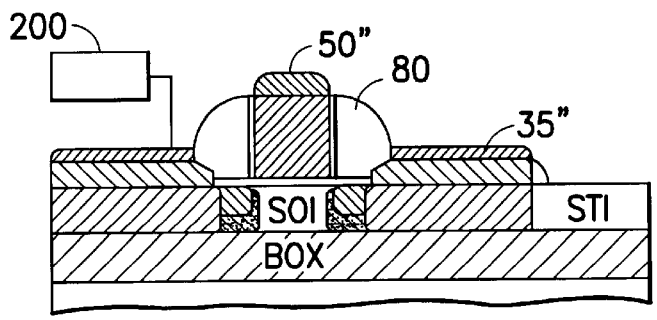
FIG. 12 shows the completed transistor.

FIG. 12 shows the final transistor, with an expanded extension and halo implant area that results from the final activation anneal of the S/D and from the siliciding. A block labeled 200 represents schematically the other transistors and interconnects that combine to form an integrated circuit.

Those skilled in the art will be able to appreciate that various modifications of the disclosed process may be made. For example, nitride 60 may be made thinner and spacers 70 used to block the area where the halo and extension implants will be. Further, the conventional order for the implants—first extension and halo, then S/D may be used, at the cost of greater thermal spread of the small implants. The annealing of the S/D could be done at any time after their implantation.

While the invention has been described in terms of a single preferred embodiment, those skilled in the art will recognize that the invention can be practiced in various versions within the spirit and scope of the following claims.

We claim:

1. A method of forming transistors in SOI processing comprising the steps of:

preparing an SOI substrate, including forming a set of STI isolation members defining a set of transistor active areas;

forming a set of gate stacks in said set of active areas;

depositing a protective layer of nitride over said set of gate stacks and over said set of STI isolation members and forming a set of temporary sidewall spacers on said set of gate stacks;

masking said set of STI isolation members and removing an exposed portion of said protective layer of nitride that is between said set of STI isolation members and said set of temporary sidewall spacers;

implanting sources and drains in said set of active areas;

removing an oxide film from said sources and drains while said STI members are protected by said protective layer of nitride;

selectively growing epitaxial raised S/D members on said sources and drains while said set of gate stacks are protected by said protective layer of nitride;

growing oxide on said raised S/D members;

removing a previously masked portion of said protective layer of nitride over said gate stack and between said raised S/D members;

annealing said S/D members and thereafter performing extension and halo implants; and forming a final gate sidewall spacer.

2. A method according to claim 1, further including a step of damaging by ion implantation said exposed portion of said protective layer of nitride before said step of removing said exposed portion of said protective layer of nitride.

3. A method according to claim 1, further including a step of removing said set of temporary sidewall spacers.

4. A method according to claim 2, further including a step of removing said set of temporary sidewall spacers.

5. A method according to claim 2, in which said step of damaging by ion implantation is effected with ions from column IV of the periodic table, whereby the same ion implantation step can be used with NFETs and PFETs.

6. A method according to claim 1, in which said step of removing said exposed portion of said protective layer of nitride is effected by a directional reactive ion etch.

7. A method according to claim 6, further including a step of removing said set of temporary sidewall spacers.

8. A method according to claim 1, in which said set of temporary sidewall spacers are formed from poly and said set of gate stacks comprise a poly gate covered by a first layer of oxide, a layer of nitride and a second layer of oxide, whereby said poly gate is protected by said first layer of oxide during said step of removing said set of temporary sidewall spacers.

9. A method according to claim 8, in which said step of removing said exposed portion of said protective layer of nitride is effected by a directional reactive ion etch.

10. A method according to claim 9, further including a step of removing said set of temporary sidewall spacers.

11. A method according to claim 2, in which said set of temporary sidewall spacers are formed from poly and said set of gate stacks comprise a poly gate covered by a first layer of oxide, a layer of nitride and a second layer of oxide, whereby said poly gate is protected by said first layer of oxide during said step of removing said set of temporary sidewall spacers.

* * * * *